United States Patent
Yanagida

[11] Patent Number: 5,918,144
[45] Date of Patent: Jun. 29, 1999

[54] METHOD OF MANUFACTURING A SEMICONDUCTOR DEVICE

[75] Inventor: Toshiharu Yanagida, Kanagawa, Japan

[73] Assignee: Sony Corporation, Tokyo, Japan

[21] Appl. No.: 08/918,442

[22] Filed: Aug. 26, 1997

[30] Foreign Application Priority Data

Aug. 29, 1996 [JP] Japan ..................................... 8-227960

[51] Int. Cl.$^6$ .................................................. H01L 21/44
[52] U.S. Cl. ........................... 438/615; 438/612; 438/613
[58] Field of Search ..................................... 438/615, 613, 438/612

[56] References Cited

U.S. PATENT DOCUMENTS

| | | | |
|---|---|---|---|
| 4,505,029 | 3/1985 | Owyang et al. | 438/615 |
| 5,143,865 | 9/1992 | Hideshima et al. | 438/615 |
| 5,310,699 | 5/1994 | Chikawa et al. | 438/615 |
| 5,541,135 | 7/1996 | Pfeifer et al. | 438/108 |
| 5,576,629 | 11/1996 | Turner et al. | 438/17 |
| 5,672,542 | 9/1997 | Schwiebert et al. | 438/4 |

*Primary Examiner*—Kevin M. Picardat
*Assistant Examiner*—Devin Collins
*Attorney, Agent, or Firm*—Hill & Simpson

[57] ABSTRACT

When BLM films as a barrier metal under solder balls are deposited to Al pad electrodes by a lift-off method utilizing a deformed resist pattern, a wafer is heated before sputter-forming of the BLM film, thereby eliminating a water content contained in a first layer polyimide film. In an rearrangement process, a wiring connecting the electrode pad and the solder ball is formed with the BLM film. Since degassing upon sputter forming of the BLM film is suppressed by the elimination of the water content, peeling of the BLM film on the first layer polyimide film is prevented. The wafer may also be heated simultaneously with the formation of the deformed resist pattern by Ar$^+$ reverse sputtering (into overhang shape). Adhesion between the surface protection film and the BLM film upon rearrangement of the solder balls is thus improved in the flip chip bonding method.

20 Claims, 9 Drawing Sheets

F I G. 10
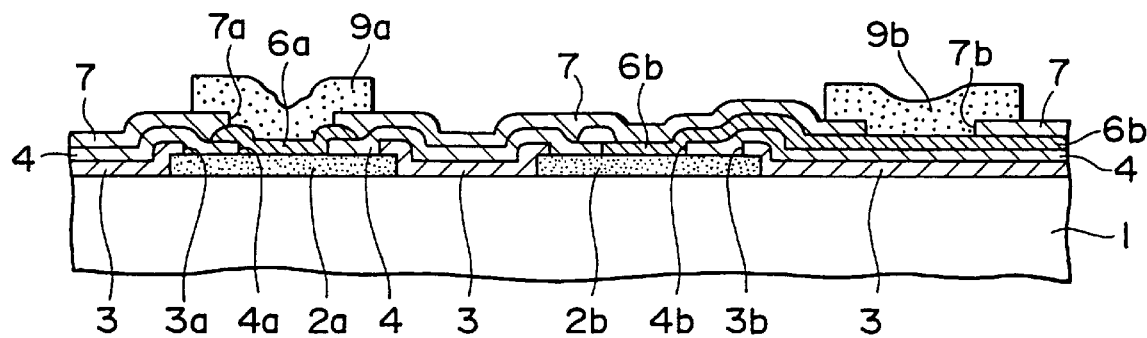
F I G. 11
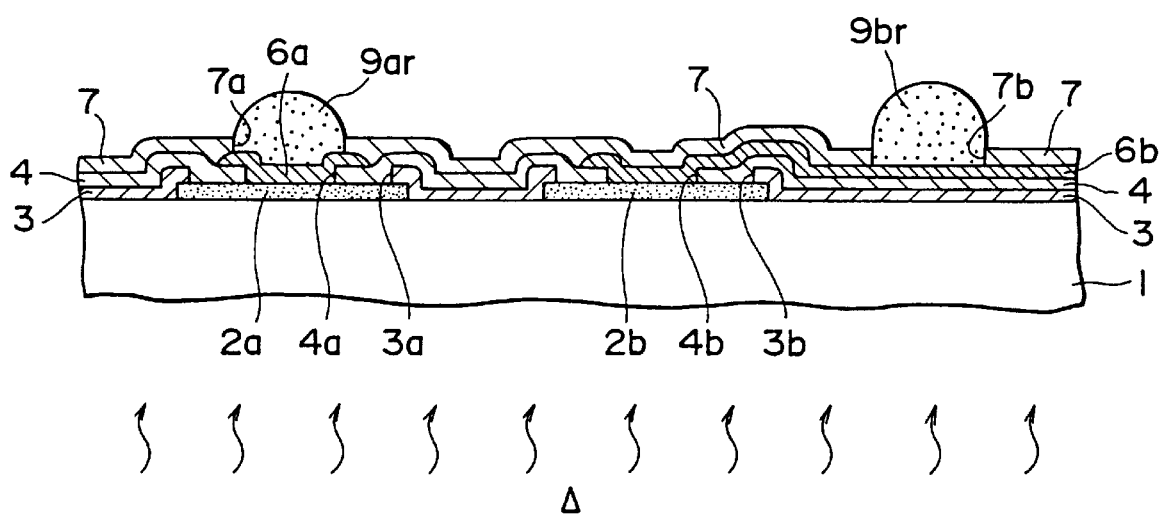

1

METHOD OF MANUFACTURING A SEMICONDUCTOR DEVICE

BACKGROUND OF THE INVENTION

1. Field of the Invention

The present invention relates to a method of manufacturing a semiconductor device of mounting a device chip by a flip chip bonding method and more particularly to a method of improving adhesion between a barrier metal used as an underlying metal film below solder balls and a surface protection film.

2. Description of Related Art

For further developing size-reduction of electronic equipments, it is an important factor how to improve the mounting density of parts. Also in semiconductor IC, a wireless bonding of directly connecting a bare chip of LSI to a conductor pattern on a mounting substrate has been proposed instead of an existent package mounting using bonding wires and a lead frame. Among all, a method of forming all electrode portions and bumps or beam leads to be connected therewith to a device chip on the device-forming surface and directly connecting them with the device-forming surface being downward to a conductor pattern on a mounting substrate is called as a flip chip bonding method, and generally utilized for the mounting of hybrid IC or application uses in large-scaled computers, since assembling steps can be made reasonable.

The flip chip bonding method includes several methods such as an Au beam lead method or solder ball (bump) method in each of which, an underlying metal film, so-called barrier metal, is formed between an Al electrode pad of IC and a bump material with an aim of improving the adhesion and preventing inter-diffusion. Particularly, in the solder ball method, since the barrier metal has an effect on a finished shape of the solder ball, it is referred to as BLM (Ball Limiting Metal).

For the constitution of the BLM film, a three-layered constitution comprising a Cr film, a Cu film and an Au film laminated in this order is most general. Among them, the Cr film at the lowermost layer functions as an adhesion layer to an electrode pad usually formed by using an Al system metal film, the Cu film as the intermediate layer functions as an anti-diffusion layer for the solder ball constituent metal and, further, the Au film at the uppermost layer functions as an antioxidant film for the Cu film, respectively.

Then, a process for forming a BLM film connected to an Al electrode pad by using a lift-off method is to be explained with reference to FIG. 15A to FIG. 15D. FIG. 15A shows a state of applying passivation to a substrate 61 and, further, resist patterning for defining a deposition range of the BLM film. Referring simply to the steps up to this state, an Al electrode pad 62 on a substrate 61 completed for the formation of all devices is patterned to a predetermined shape. Then, the entire surface of the substrate (wafer) is covered with an SiN passivation film 63, and an window is opened for exposing the Al electrode pad 62. The device chip is completed in this step.

Then, the entire surface of the wafer is covered with a first layer polyimide film 64 as a surface protection film, and the film is patterned to form an opening 64a for exposing the Al electrode pad 62. The BLM film is in contact with the Al electrode pad 62 by way of the opening 64a. Further, a photoresist coating film is formed for the entire surface of the substrate, and a resist pattern 65 is formed by way of photolithography and development. An opening 65a greater than the opening 64a is formed, being faced to the Al electrode pad 62 to the resist pattern 65.

Then, as shown in FIG. 15B, the resist pattern 65 is deformed into an overhang shape to form a deformed resist pattern 65d. The deformation is conducted by applying a reverse sputtering to the resist pattern 65 and thermally expanding the surface layer of the film.

Then, as shown in FIG. 15C, a Cr film, a Cu film and an Au film are successively formed by sputtering to deposit a BLM film. Since the flying direction of sputter particles is defined within a narrow range to the substrate surface in the sputtering method, the BLM film is not deposited on the side wall surface of the deformed resist pattern 65d having the overhang shape as described above. Accordingly, a BLM film 66a connected with the Al electrode pad 62 and a BLM film 66d deposited on the deformed resist pattern 65d are isolated and the latter BLM film 66b is an unrequited portion.

Further, when the wafer in this state is dipped in a resist peeling solution and put to a shaking treatment under heating, as shown in FIG. 15D, the deformed resist pattern 65 is peeled off and, at the same time, the unrequired BLM film 66b loses the deposition base and is removed while only the BLM film 66a connected to the Al electrode pad 62 is left.

Subsequently, a solder film for completely covering the BLM film 66a is formed, for example, by a lift-off method and, successively, heat reflow is applied. In this step, the solder film shrinks in self-alignment on the BLM film 66a by surface tension into solder balls. When the solder balls formed on the chip and the conductor pattern on the mounting substrate previously soldered are pressed while aligning and fused by heating, mounting of the chip is completed.

By the way, the Al electrode is usually disposed at the periphery of the device chip. However, as the device prepared into the chip is made finer and the distance with the Al electrode pad is reduced, it becomes difficult to form solder balls as usual. This is because contact between adjacent solder ball results in a worry of short-circuit.

However, if the diameter of the solder ball is decreased in order to avoid contact between the solder balls, the bonding strength between the mounting substrate and the device chip is lowered to deteriorate the reliability. Therefore, the present applicant has previously proposed a technique of changing the layout for solder balls while leaving the diameter thereof as usual and disposing the solder balls out of a region for forming the Al electrode pad (hereinafter referred to as rearrangement). In this technique, a wiring pattern up to a place for the rearrangement with the Al electrode pad is additionally required, and the wiring pattern is formed with the BLM film. Accordingly, since only the usual photomask pattern may be changed, the number of steps is not increased and this is extremely advantageous in view of the cost and the manufacturing efficiency.

FIG. 1 shows a portion of a device chip formed with solder balls. The lamination relation for each of material films constituting the device chip illustrated in the drawing is substantially identical with that shown in FIG. 15.

On the device chip, Al electrode pads 2a, 2b are arranged along a certain side. The Al electrode pads 2a, 2b are covered thereon with an SiN passivation film 3 having an opening 3a, and a first layer polyimide film 4 having an opening 4a to a further inside of the opening 3a successively, and connected with a BLM film 6 at the inside of the opening 4a. The BLM film includes two types. That is, they are BLM film 6a for a determined position patterned only just above the Al electrode pad 2a and a BLM film 6b for rearrangement extended to the outside of the region for forming the Al electrode pad 2b.

The entire surface of such a wafer is further covered with a second layer polyimide layers 7 shown by a dotted line in the figure, and openings 7a and 7b are formed in the second layer polyimide film 7. In this case, the opening 7a is formed just above the Al electrode pad 2a, while the opening 7b is formed to the outside of the region for forming a the Al electrode pad 2b. Solder balls 9ar, 9br are connected at the inside of the openings 7a, 7b to the Al electrode pads 2a, 2b by way of the BLM films 6a, 6b respectively, in which the former solder balls 9ar are formed at the positions identical with those in the existent case (determined position), while the latter solder balls 9br are formed at the positions different from the existent case (rearrangement). With such a layout, the solder balls are not brought into contact with each other upon fusion under heating.

However, in the actual process for rearrangement described above, there has come across cross a new problem for the insufficient adhesion of the BLM film 6b with the underlying portion. That is, in the existent process of forming the BLM film 6a only at the defined position, since a most portion at the bottom of the BLM film 6a is in contact with the Al electrode pad 2a, there is no problem for the adhesion with the underlying portion. However, as the BLM film 6b is extended for rearrangement, and the area of contact with the first layer polyimide film 4 is increased, the BLM film 6b is often peeled due to the insufficiency of adhesion between both of films. If such peeling should occur, strength for the solder bonding portions of assembled products by the flip*chip* bonding method can no more be ensured to give undesired effects on the reliability and the durability of the products.

SUMMARY OF THE INVENTION

In view of the above, it is an object of the present invention to provide a method of manufacturing a semiconductor device of high reliability by increasing the adhesion between a surface protection film typically represented by a polyimide film and a BLM film also in a case of rearrangement for solder balls in the flip chip bonding method.

The foregoing effect of the present invention can be attained by a method of manufacturing a semiconductor device according to the present invention in a process of forming an underlying metal film, that is, a BLM film for defined position and rearrangement by a lift-off method, wherein a substrate is heated before forming the BLM film to cure a surface protection film as an underlying portion thereof.

A major object of curing the surface protection film conducted in the present invention is to eliminate a water content incorporated into the film. Incorporation of the water content is caused upon forming a resist pattern for defining a deposition position of a BLM film on the surface protection film during wet treatment such as resist coating or developing treatment. In the present invention, since the water content is previously eliminated before forming the BLM film, degassing from the surface protection film during or after the formation of the BLM film is suppressed. As a result, peeling of the BLM film on the surface protection film is prevented and the reliability of assembled products by the flip chip bonding method is improved.

It is of course necessary in the present invention to conduct curing at a temperature capable of eliminating the water content from the surface protection film. In addition, since the resist pattern for defining the deposition range of the BLM film has also been formed upon applying curing, it is necessary to apply curing in a region of temperature lower than the softening temperature of the resist pattern. In a case of using, for example, a polyimide film as a surface protection film, the temperature range is, particularly suitably, about from 75 to 100° C.

Upon practicing the lift-off method, deformation of the resist pattern is preferably utilized and it is particularly effective to apply a reverse sputtering thereby deforming the pattern into the overhang shape. This overhang shape is effective in preventing the BLM film from depositing on the side wall surface of the resist pattern and facilitating elimination of the unrequired portion of the BLM film. The mechanism of the deformation of the pattern is expansion of the surface layer of the film by the conversion of a kinetic energy of ions colliding at high speed against the resist surface into heat energy.

In this case, the reverse sputtering is suitably applied by using a plasma device capable of controlling plasma excitation and substrate biasing independently. This is because the deformation can be conducted rapidly by using a great amount of ions while keeping the kinetic energy of ions incident to the resist surface at an appropriate value.

For example, in a usual parallel plate type RF plasma device, a high frequency power determining a plasma density and a bias voltage determining an incident ion energy can be adjusted only under a constant correlationship, so that if the plasma density is increased the bias voltage also increases. Therefore, if it is intended to efficiently deform the resist pattern by utilizing the high density plasma, the incident ion energy is increased to cause thermal deformation not only at the surface layer of the resist but also in the deep portion of the film, by which the resist pattern is scorched on the surface protection film. On the contrary, if it is intended to prevent the thermal deformation in the deep portion of the film by lowering the plasma density, it requires as long as 5 to 6 minutes for the deformation to remarkably deteriorate throughputs.

Use of a device capable of controlling the plasma excitation and the substrate biasing independently can avoid such disadvantages. Examples of such devices can include, for example, a triode type RF plasma device, a magnetic film microwave plasma device, an induction coupling plasma device and a helicon wave plasma device.

The reverse sputtering of the present invention is applied particularly preferably by using a plasma device capable of attaining a plasma density of higher than $1 \times 10^{10}/cm^3$ and lower than $1 \times 10^{14}/cm^3$. In the triode type RF plasma device, a plasma density at an order of $10_{10}/cm^3$ can be attained. Devices capable of attaining a plasma density at an order of higher than $1 \times 10^{11}/cm^3$ have particularly referred collectively as a high density plasma (HDP) device in recent years, and the plasma density can be excited at the order of $10^{11}/cm^3$ by the magnetic field microwave plasma device, at the order of $10^{12}/cm^3$ by the induction coupling plasma device and at the order of $10^{13}/cm^3$ by the helicon wave plasma device, respectively.

By the way, in the present invention, the underlying metal film described above is formed particularly suitably, after the completion of curing continuously in a state of shielding the substrate from atmospheric air. This is conducted in order not to absorb moisture in the surface protection film from which water content has been eliminated. For this purpose, it is preferred to use a continuous processing type device in which a chamber for conducting curing and a film-forming chamber for the underlying metal film are connected by way of a vacuum transportation channel having a gate valve.

BRIEF DESCRIPTION OF THE ACCOMPANYING DRAWINGS

FIG. 10 is a schematic cross sectional view illustrating a state of lifting off a resist pattern shown in FIG. 9 and removing a not required portion of a solder film;

FIG. 11 is a schematic cross sectional view illustrating a state of forming solder balls by heating a substrate;

Figure 15A:
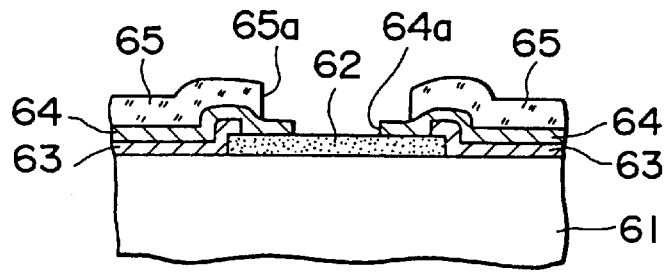
Figure 15B:
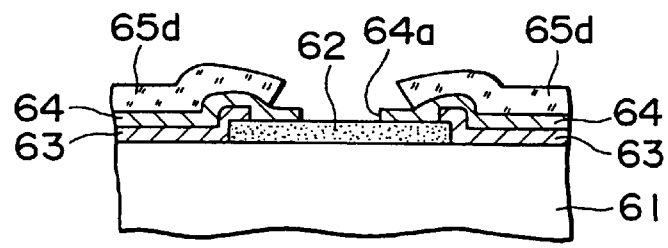
Figure 15C:
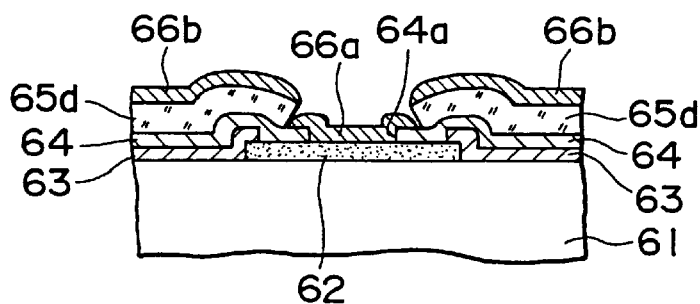
Figure 15D:
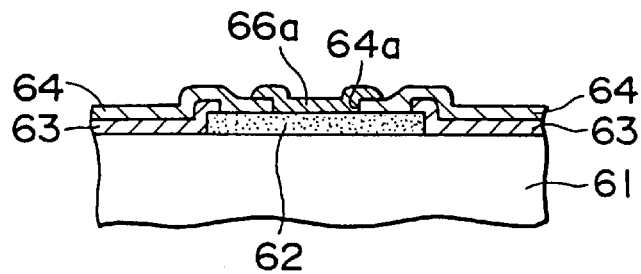

FIG. 15A to FIG. 15D are, respectively, schematic cross sectional views illustrating a process for forming a BLM film on an electrode pad by a general lift-off method in which FIG. 15A shows a resist patterning step, FIG. 15B shows a step of deforming a resist pattern, FIG. 15C shows a step of depositing a BLM film and FIG. 15D shows a step of removing an unrequired portion of a BLM film by lifting off, respectively.

Two examples for the constitution of such a continuous processing type device will be explained with reference to FIG. 12 and FIG. 13.

Figure 12:
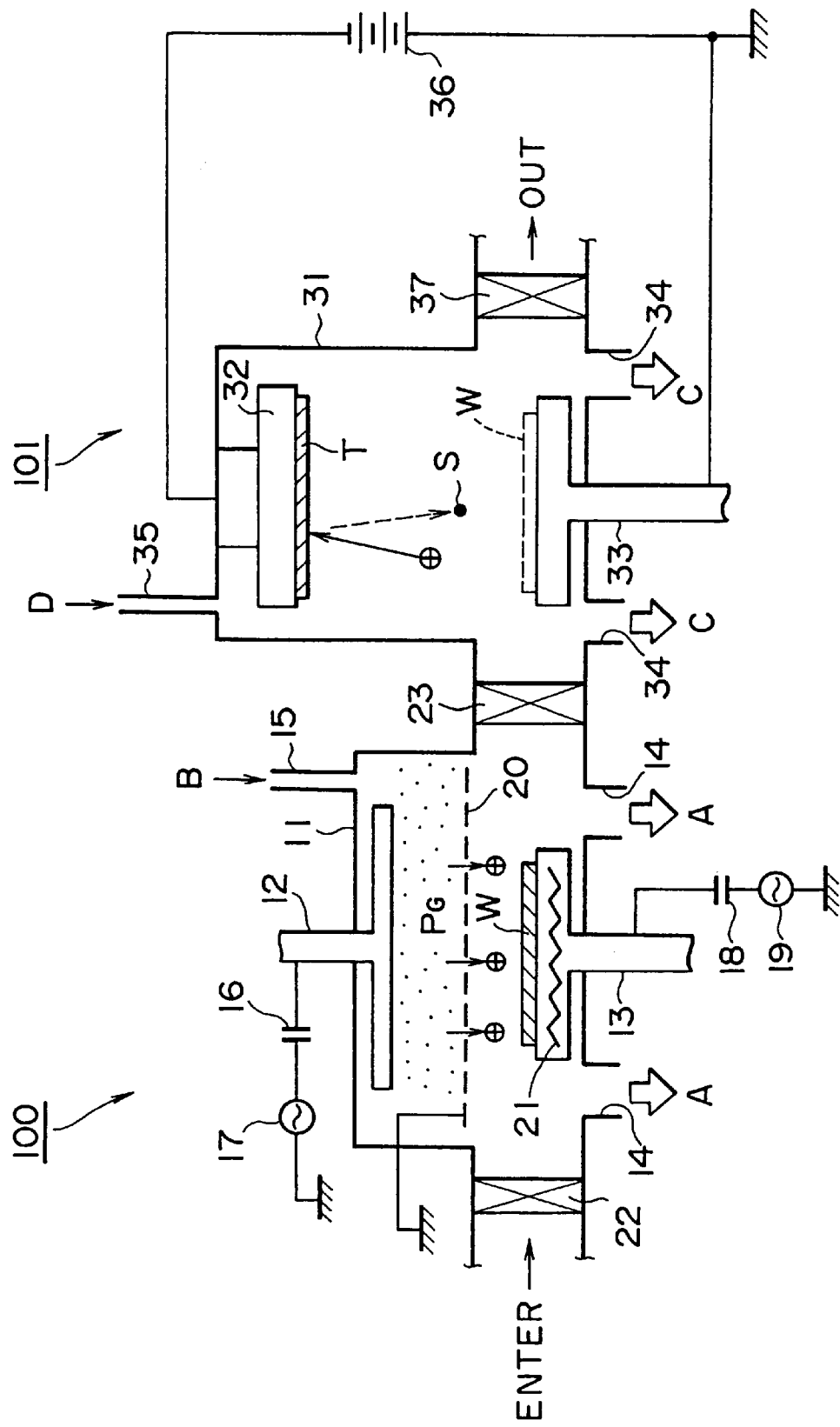
FIG. 12 is a schematic cross sectional view illustrating an example of a constitution for a continuous processing type device in which a triode type RF plasma processing device and a DC sputtering device are connected.

The device shown in FIG. 12 is a continuous processing type device in which a triode type RF plasma device 100 and a DC sputtering device 101 are connected by way of a gate valve 23.

The triode type RF plasma device 100 has a 3-electrode structure in which an upper electrode 12 as an anode and a lower electrode 13 as a cathode also serving as a wafer stage are opposed in a processing chamber 11 and, further, a grid electrode 20 is disposed between both of the electrodes. The inside of the processing chamber 11 is evacuated by a not-illustrated evacuation system through an exhaust port 14 in the direction of an arrow A, and, on the other hand, supplied with a gas necessary for the process through a gas supply pipe 15 in the direction of an arrow B, thereby maintained at a predetermined pressure.

DESCRIPTION OF PREFERRED EMBODIMENTS

RF power sources 17, 19 are connected by way of blocking capacitors 16, 18 for interrupting DC components, respectively, to the upper electrode 12 and the lower electrode 13. The RF power source is for plasma excitation and the RF power source 19 is for application of a substrate bias, and frequencies for both of the sources are set to values different from each other for avoiding interference. with such a constitution, the plasma density and the substrate bias can be controlled independently in this triode type RF plasma device 100.

Plasma $P_G$ is generated by glow discharge between the upper electrode 12 and the grid electrode 20 put to the ground potential, and positive ions passing through the grid are incident to a wafer W placed on the lower electrode 13.

The lower electrode 13 is incorporated with a heater 21 which can elevate the temperature of the wafer W required for curing and deformation of the resist.

In the DC sputtering device as the other section, an upper electrode 32 as a cathode for holding a target T and a lower electrode 33 as an anode for holding a wafer W are opposed in a processing chamber 31. The inside of the processing chamber 31 is evacuated by a not illustrated evacuation system through an exhaust port 34 in the direction of an arrow C and supplied, on the hand, with a sputtering gas required for the process through a gas supply pipe 35 in the direction of an arrow D, thereby maintained at a predetermined pressure.

A DC power source 36 is connected between the upper electrode 32 and the lower electrode 33. In this device, positive ions of the sputtering gas generated by DC grow discharge inside the processing chamber 31 are incident to the target T and driven out sputter particles S are deposited on the wafer W.

In such a continuous processing type device, the wafer W is transported by way of the gate valve 22 into the processing chamber 21 of the triode type RF plasma device 100, in which it is put to curing and deformation of the resist and then entered by way of the gate valve 23 into the processing chamber 31 of the DC sputtering device 101. Then, after completing the formation of the underlying metal film, the wafer is delivered by way of the gate valve 37 out of the device. Since the wafer W is not opened to the atmospheric air through the series of the processes, a BLM film can be deposited on the surface protection film in a state in which the water content is sufficiently removed therefrom.

Then, another example for the constitution of the continuous processing type device will be explained with reference to FIG. 13. This device is adapted to conduct curing of the surface protection film and the deformation of the resist pattern by using an induction coupling plasma device 102 and then put the wafer W into a sputtering device connected by way of a gate valve 54 and conduct deposition of the underlying metal film continuously. Since the sputtering device can be constituted like that the DC sputtering device 101 in FIG. 12 illustrated above, it is not illustrated and explained here.

The induction coupling plasma device 102 is a device for exciting induction coupled plasma $P_I$ in the chamber by using an RF power applied from a multi-turn antenna 49 wound around the outer circumference of a processing chamber 40.

The ceiling portion of the processing chamber 40 constitutes an upper electrode 42 also serving as an upper lid, and a portion of the side wall surface constitutes a cylinder 41 comprising a non-conductive material such as quartz. The inside of the processing chamber 40 is evacuated by a not-illustrated evacuation system by way of an exhaust port 44 in the direction of an arrow E and, on the other hand, supplied with the sputtering gas necessary for the process by way of a gas supply port 45 in the direction of an arrow F, thereby maintained at a predetermined pressure.

The multi-turn antenna 49 is wound around the outer circumference of the cylinder 41 and connected to an RF power source 50 for plasma excitation. The number of turns of the multi-turn antenna 49 is optimized depending on the diameter of the cylinder 41 and the frequency of the RF power source 50.

Inside the processing chamber 40, a lower electrode 43 serving also as a wafer stage is disposed so as to oppose to the upper electrode 42. The lower electrode 43 is connected by way of a blocking capacitor 47 with an RF power source 48 for bias application. With such a constitution, the plasma density and the substrate bias can be controlled independently in the induction coupling plasma device 102.

Further, the lower electrode 43 is incorporated with a heater 52 which can elevate the temperature of the wafer W required for curing and deformation of the resist.

Figure 13A:
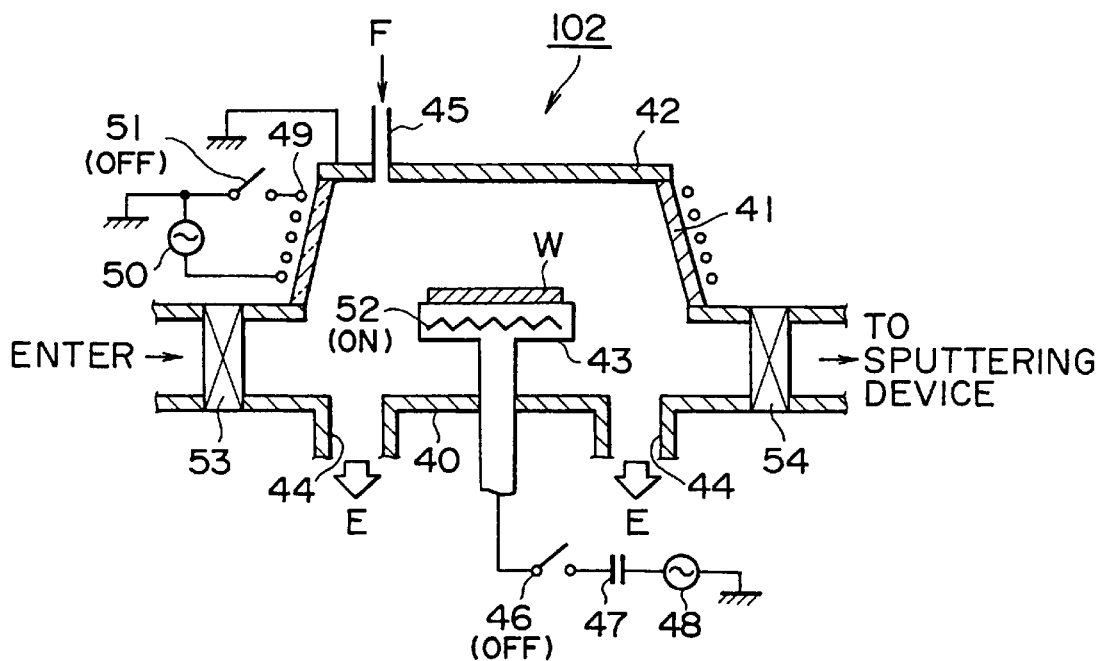
FIG. 13A and FIG. 13B are, respectively, schematic cross sectional views illustrating a portion of a induction coupling plasma device in other continuous processing type device used in the present invention.
Figure 13B:
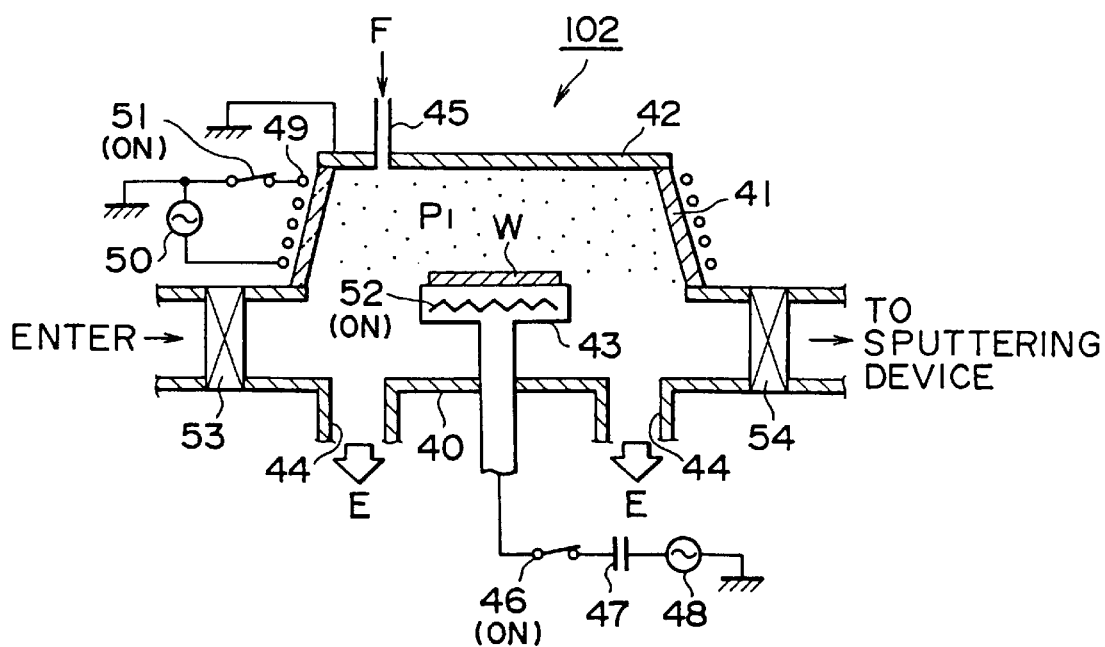

In the present invention, since the induction coupling plasma device 102 is used also for an aim of merely heating the wafer not exciting the plasma $P_I$, switches 51, 46 are disposed to the connection systems of the RF power source 50 for plasma excitation and the RF power source 48 for bias application respectively, such that both of the substrate heating and reverse sputtering can be conducted by ON/OFF control of them. That is, FIG. 13(a) illustrates a state of using the device in which both of the switches 51, 46 are kept OFF, by which the plasma $P_I$ is not excited and only the wafer heating is conducted, whereas FIG. 13(b) illustrates a state of using the device in a state where both of the switches 51, 46 are kept ON, by which the plasma $P_I$ is excited and reverse sputtering is conducted.

By the way, deformation of the resist pattern may be conducted simultaneously with the curing for the surface protection film, or after the completion of the curing for the surface protection film. In the latter case, it is particularly effective to conduct the curing for the surface protection film and the deformation for the resist pattern continuously in one identical plasma chamber with a view point of improving the throughput and preventing contamination.

The typical constituent material of the pad electrode is an Al system metal film. Further, the underlying metal film is, typically, a laminate film comprising a Cr film, a Cu film and an Au film laminated in this order. There exists no problem for the adhesion of the laminate film to the Al system metal film, the present invention can also improve the adhesion between the laminate film and the surface protection film, particularly, the polyimide film, and can conduct the process for rearrangement at a extremely high reliability.

EXAMPLES

Concrete examples of the present invention will be explained.

EXAMPLE 1

In this example, a polyimide film was used as the surface protection film, and curing for the polyimide film and the deformation of the resist pattern were conducted simultaneously prior to the formation of the BLM film by using the triode type RF plasma device 100 shown previously in FIG. 12, and the BLM film was formed immediately thereafter by using the DC sputtering device 101 shown in FIG. 12.

The process described above will be explained with reference to FIG. 2 to FIG. 11. Each of the drawings represents a portion corresponding to the cross section taken along line A—A in FIG. 1. Further, in the reference numerals, each affix is attached to a portion relevant to the determined position while the affix b is attached to a portion relevant to the rearrangement, respectively.

Figure 1:
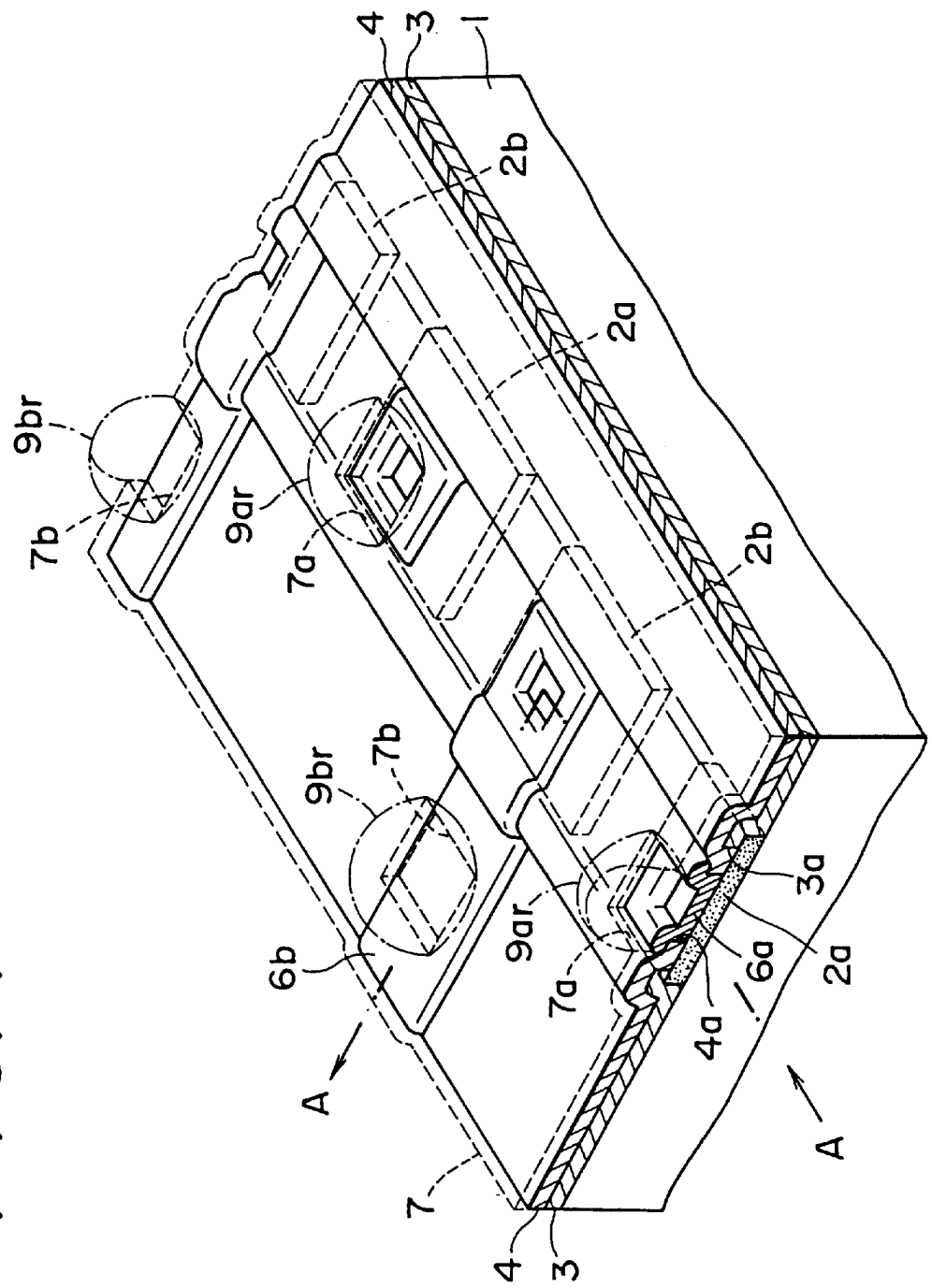
FIG. 1 is a perspective view for a portion illustrating a rearranged state of solder balls on a chip.
Figure 2:
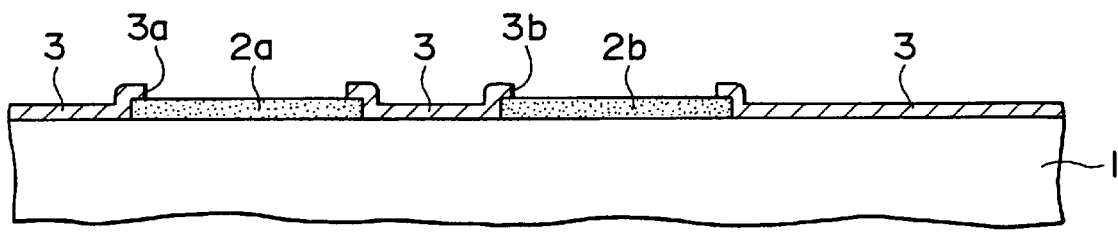
FIG. 2 is a schematic cross sectional view illustrating a state in which Al electrode pads and an SiN passivation film are patterned in an example of a process to which the present invention is applied.

At first, as shown in FIG. 2, Al electrode pads 2a, 2b were patterned on a substrate 1 in which formation of all devices was completed. Then, the entire surface of the substrate was coated with an SiN passivation film 3 formed, for example, by a plasma CVD method and, further, the film was patterned to form openings 3a, 3b so as to expose the Al electrode pads 2a, 2b respectively. This is a usual completed state for a device chip. As also shown in FIG. 1 described above, the Al electrode pad 2a is a pad having a solder ball to be formed just above in the subsequent step (determined position), while the Al electrode pad 2b is a pad not having a solder ball being formed just above.

Figure 3:
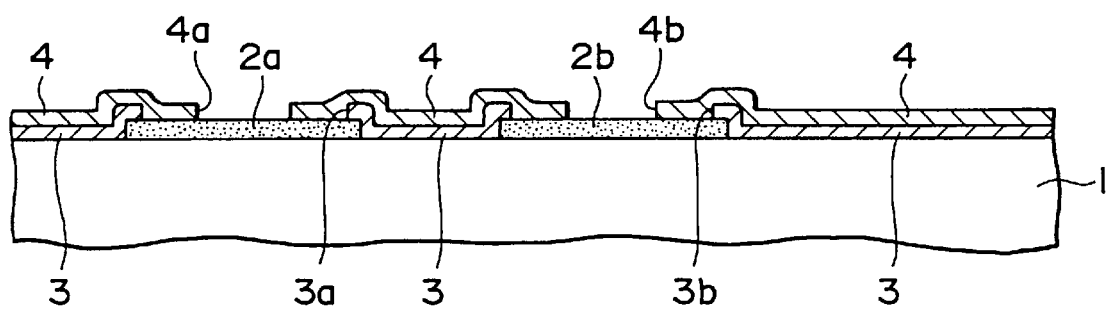
FIG. 3 is a schematic cross sectional view illustrating a state of patterning a first layer polyimide film and forming an opening being faced to an Al electrode pad on a substrate shown in FIG. 2.

Then, as shown in FIG. 3, the entire surface of the substrate (wafer) was coated with a first layer polyimide film 4 as a surface protection film, and the film was patterned to form openings 4a, 4b for exposing the Al electrode pads 2a, 2b respectively. The openings 4a, 4b are opened to the inner side of the openings 3a, 3b of the SiN passivation film 3 formed previously and they defined the area of contact between the Al electrode pads 2a, 2b and the BLM film to be formed in the subsequent step.

Figure 4:
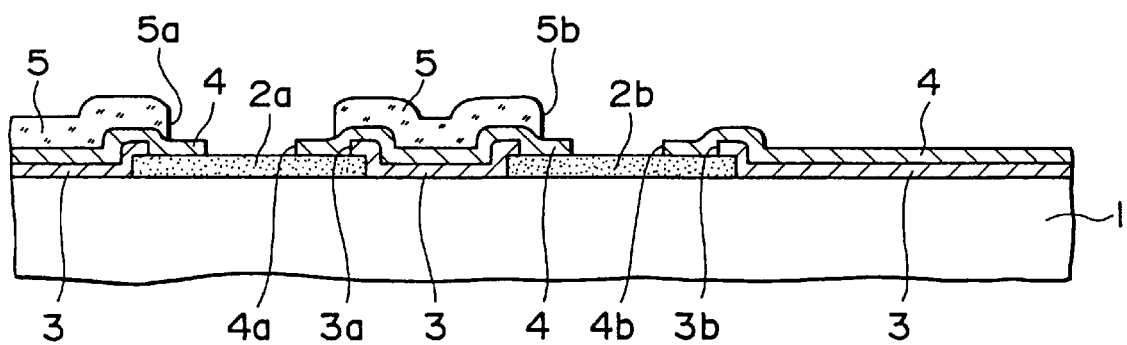
FIG. 4 is a schematic cross sectional view illustrating a state of applying resist patterning for defining a deposition position of a BLM film on the substrate shown in FIG. 3.

Then, as shown in FIG. 4, usual resist coating, photolithography and development were conducted to form a resist pattern 5. The resist pattern 5 has an opening 5a formed, being faced to the Al electrode pad 2a, for defining the deposition portion of the BLM film for the determined position (reference 6a in FIG. 6), and an opening 5b, being spaced to the Al electrode pad 2b, for defining the deposition position of the BLM film for rearrangement (reference 6b in FIG. 6).

Then, the wafer was entered in the triode type RF plasma device 100 described above, in which the curing for the first layer polyimide film 4 and the deformation of the resist pattern 5 were conducted simultaneously. The conditions in this case were set, for example, as:

| | |
|---|---|
| Ar flow rate | 25 SCCM |
| Pressure | 0.7 Pa |
| Sour power | 600 W (RE power source 17, 2 MHz) |
| Bias voltage | 250 V (RF power source 19, 13.56 MHz) |
| Heater setting temperature | 80° C. |
| Processing time | 5 min. |

Figure 5:
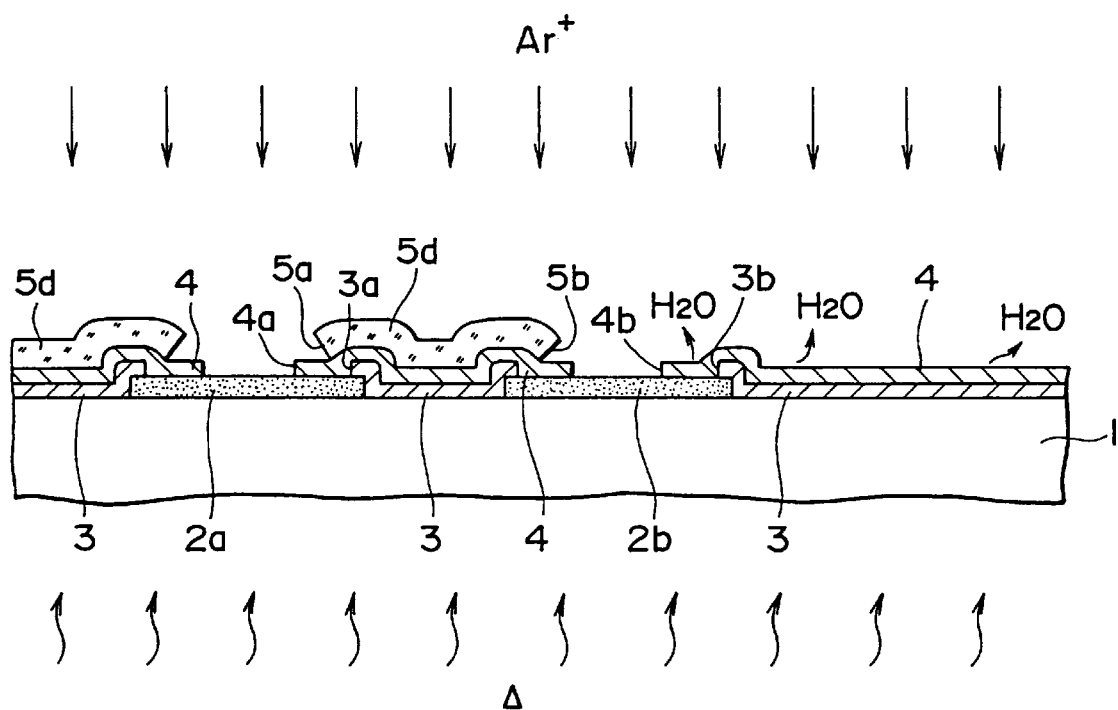
FIG. 5 is a schematic cross sectional view illustrating a state of applying curing for a first layer polyimide film and deforming a resist pattern by reverse sputtering by substrate heating.

During the processing described above, the temperature of the wafer W was elevated finally to about 100° C. by heat transmission from the lower electrode 13, irradiation heat from the plasma $P_G$, and conversion of the kinetic energy of incident ions into heat energy. Thus, the water content absorbed or adsorbed to the first layer polyimide film 4 was eliminated. Simultaneously, the surface layer portion of the resist pattern 5 caused thermal expansion undergoing incidence of $Ar^+$ into a deformed resist pattern 5d exhibiting an overhang shape as shown in FIG. 5.

The bias voltage in this step is set particularly preferably to about less than 300 V. This is because deformation or transformation of the resist proceeds excessively before sufficient elimination of the water content if the bias voltage is too high.

Then, the wafer W was entered through the gate valve 23 into the DC sputtering device 100 in which a Cr film (about 0.1 μm thick), a Cu film (about 1.0 μm thick) and an Au film (about 0.1 μm thick) were successively formed by sputtering. The film forming conditions in this case were, for example, as:

| | | |
|---|---|---|
| Cr film: | Ar flow rate | 75 SCCM |
| | Pressure | 1.0 Pa |
| | DC power | 3.0 kW |
| | Substrate temperature | room temperature |
| Cu film: | Ar flow rate | 100 SCCM |
| | Pressure | 1.0 Pa |
| | DC power | 9.0 kW |
| | Substrate temperature | room temperature |
| Au film: | Ar flow rate | 75 SCCM |
| | Pressure | 1.5 Pa |
| | DC power | 3.0 kW |
| | Substrate temperature | room temperature |

Figure 6:
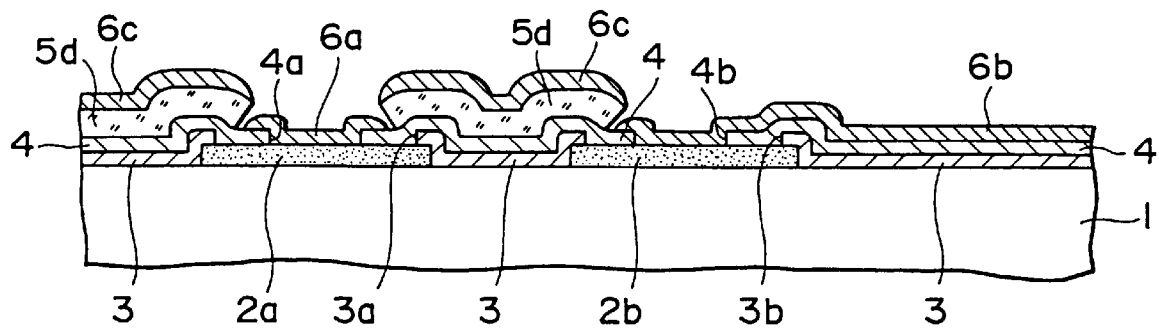
FIG. 6 is a schematic cross sectional view illustrating a state of depositing a BLM film on a substrate.

By the sputtering, as shown in FIG. 6, a BLM film was formed. However, since the incident direction of sputter particles is defined within a narrow range relative to the substrate surface in the sputtering, the BLM film is not deposited on the side wall surface of the deformed resist pattern 5d having the overhang shape as described above. Accordingly, while a BLM film 6a for the determined position is deposited on the Al electrode pad 2a and a BLM film 6b for rearrangement is deposited to the Al electrode pad 2b, respectively, each of them is isolated in self-alignment from a BLM film 6c deposited on the deformed resist pattern 5d. The BLM film 6c is an unrequired portion.

In the present invention, different from the existent process in which the BLM film is formed only on the Al electrode pad, since the BLM film 6b for rearrangement is extended onto the first layer polyimide film 4, the area of contact between the underlying metal film and the polyimide film is large. However, the adhesion between both of the films is improved by the curing and no peeling of the BLM film was observed.

Figure 14:
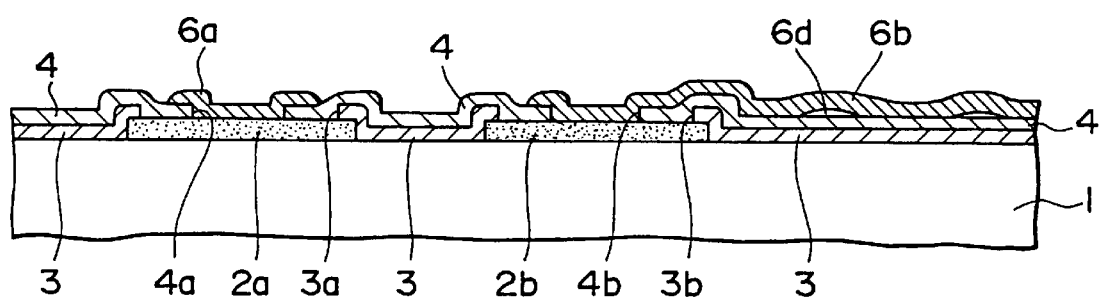
FIG. 14 is a schematic cross sectional view illustrating a state in which the BLM film for rearrangement is partially peeled on the first layer polyimide film in the existent process for forming solder balls.

For the comparison, when the BLM film was formed on the wafer which was not applied with the curing by the substrate heating but applied only with the resist deformation by the reverse sputtering in the triode type RF plasma device 100, peeled portions 6d as shown in FIG. 14 were formed.

Figure 7:
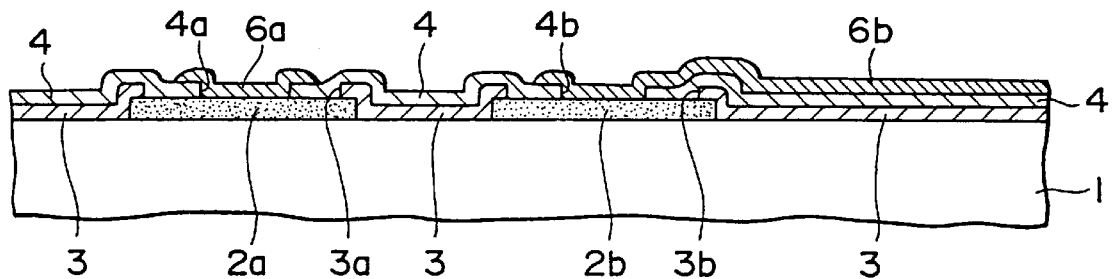
FIG. 7 is a schematic cross sectional view illustrating a state of lifting off a deformed resist pattern shown in FIG. 6 and removing an unrequited portion of the BLM film.

Then, the wafer was dipped in a resist peeling solution and subjected to a shaking treatment under heating. The resist peeling solution comprises, for example, dimethylsulfoxide (DMSO) and N-methyl-2-2-pyrrolidone ($CH_3NC_4H_6O$). As a result, as shown in FIG. 7, along with the peeling of the deformed resist pattern 5d, the unrequired BLM film 6c deposited thereon were eliminated together to leave only the BLM films 6a, 6b to be connected with the Al electrode pads 2a, 2b.

Figure 8:
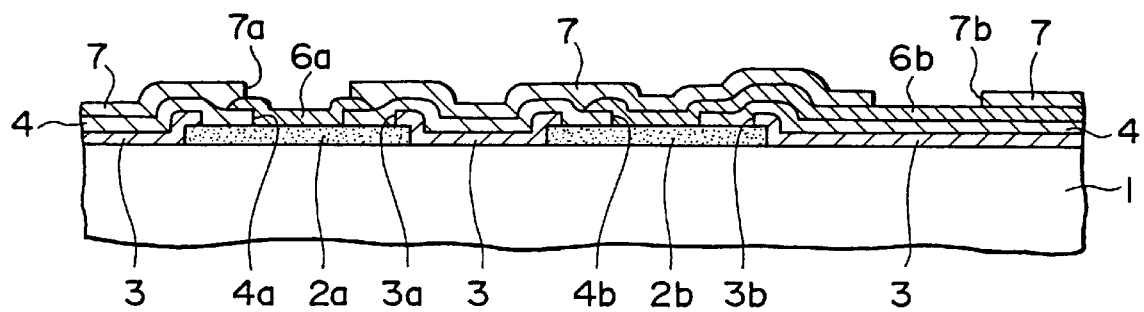
FIG. 8 is a schematic cross sectional view illustrating a state of applying patterning to a second layer polyimide film for defining positions of forming solder balls on the substrate shown in FIG. 7.
Figure 9:
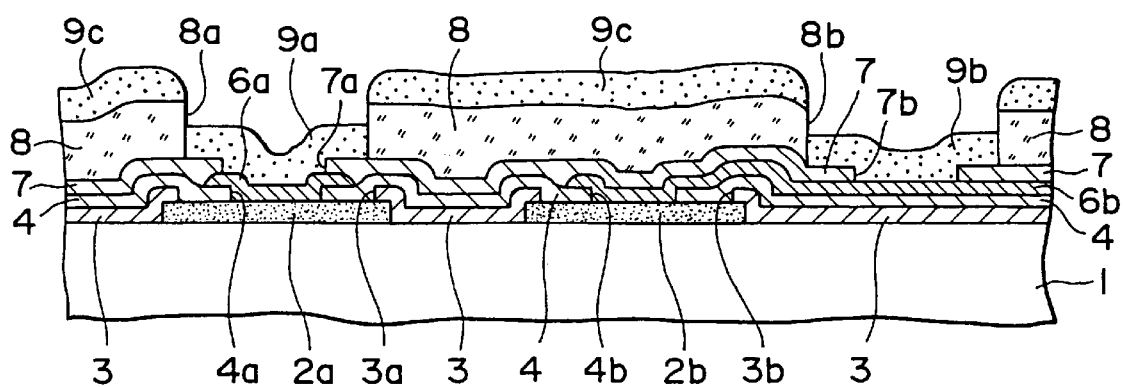
FIG. 9 is a schematic cross sectional view illustrating a state of applying resist patterning for defining depositing positions of a solder film on a substrate in FIG. 8 and further vapor depositing the solder film.

Then, it goes into the solder ball forming step. That is, as shown in FIG. 8, a second layer polyimide film 7 was at first formed for the entire surface of the wafer, and patterning for defining the positions of forming the solder balls was conducted to form openings 7a, 7b. The opening 7a is formed for the determined position and formed such that the BLM film 6a is exposed just above the Al electrode pad 2a. On the contrary, the opening 7b is formed such that the BLM film 6b is exposed to the outside of the region for forming the Al electrode pad 2b.

Then, a resist film was formed for the entire surface of the wafer, and resist patterning was applied for defining the deposition position of the solder film. This patterning formed a resist pattern 8 including the openings 7a, 7b described above and having openings 8a, 8b sufficiently larger than them. The film of the resist pattern 8 was made to such a thickness as enough to disconnect the solder film in the succeeding step.

Successively, a solder film (Pb-3%Sn) was vapor deposited for the entire surface of the wafer. This formed a solder film 9a connecting with the BLM film 6a at the inside of the opening 8a and formed a solder film 9b connected with the BLM film 6b at the inside of the opening 8b, but both of them are disconnected in self-alignment from the unrequired solder portion 9c deposited on the resist pattern 8.

When the wafer was dipped again in the resist peeling solution and subjected to a shaking treatment under heating to remove the resist pattern 8 and the unrequired solder film 9c, a state as shown in FIG. 10 was attained in which only the solder film 9a for the determined position and the solder film 9b for the rearrangement were left.

Subsequently, solder balls were formed by way of a so-called wet back step. That is, flux was coated on the patterned solder films 9a, 9b. The flux comprises an amine type activator, an alcoholic solvent, rosin and a resin such as polyglycol as a main ingredient and has an effect of reduction and surface activation for the solder films 9a, 9b. When the temperature in this state was elevated stepwise in an $N_2$ atmosphere, the solder films 9a, 9b shrunk spherically while melting by the surface tension of its own. As a result, as shown in FIG. 11, a solder ball 9ar for the determined position was formed on the BLM film 6a, and a rearranged solder ball 9br was formed on the BLM film 6b.

Subsequently, the wafer was divided by dicing into individual chips, and the solder balls 9ar, 9br were fused by heating while aligning with the conductor pattern on the previously soldered mounting substrate thereby completing the mounting of the chips. Since the thus completed assembled products have a sufficient strength ensured for the solder bonding portions, it was confirmed that the reliability and the durability were remarkably improved compared with existent products. Further, the film quality per se of the BLM film was also improved and the contact resistance and the wiring resistance were reduced. This is because the water content was sufficiently removed from the first layer polyimide film previously before forming the BLM film and degassing from the BLM film into the sputtering atmosphere can be suppressed and the film formation was proceeded under a stable condition.

EXAMPLE 2

In this example, using the induction coupling plasma device 102 shown in FIG. 13, curing was conducted for the first layer polyimide film 4 by the wafer heating in a state not exciting plasma $P_I$ within an identical device.

That is, the same procedures as those in Example 1 were practiced up to the formation of the resist pattern 5 and then the wafer was entered into the induction coupling plasma device 102 shown in FIG. 13, and curing was conducted while interrupting plasma excitation as shown in FIG. 13A. The conditions in this case were set, for example, as:

| | |
|---|---|
| Ar flow rate | 100 SCCM |
| Pressure | 2 Pa |
| Heater setting temperature | 95° C. |
| Processing time | 120 sec |

Then, the device was switched to the plasma excitation state shown in FIG. 13B, and reverse sputtering was conducted. The conditions in this instance were set, for example, as:

| | |
|---|---|
| Ar flow rate | 25 SCCM |
| Pressure | 0.7 Pa |
| Sour power | 600 W (RE power source 17, 2 MHz) |
| Bias voltage | 250 V (RF power source 19, 13.56 MHz) |
| Heater setting temperature | 95° C. |
| Processing time | 120 sec. |

By this processing, a deformed resist pattern 5d having the overhang shape was formed. Subsequent steps were conducted like that in Example 1.

In this example, since the resist pattern 5 is deformed in a state in which the water content is not eliminated from the first layer polyimide layer 4 previously, the water content is removed more thoroughly. Accordingly, also in the succeeding step for forming the BLM film, degassing from the first layer polyimide film 4 or from the deformed resist pattern 5d can be suppressed extremely low, and the film quality of the BLM film was improved more compared with Example 1.

While the present invention has been explained with reference to the two types of examples, but the present invention is no way restricted to such examples. For example, the continuous processing device to be used, details for the constitution of the sample wafer, curing conditions and reverse sputtering conditions can be properly changed or selected. Further, the solder film may be formed not only by the vapor deposition as described above but also by an electric field plating.

As has been apparent from the foregoing explanations, according to the present invention, adhesion between the surface protection film typically represented by the polyimide film and the BLM film can be improved and the film quality itself of the BLM film can be improved also in a case of rearrangement for solder balls in the flip*chip *bonding method. Accordingly, it can provide a semiconductor device mounting, at a high density, a device capable of high speed operation and of excellent reliability and durability.

What is claimed is:

1. A bump forming method including the following steps;
    a step of forming a pad electrode on a substrate,
    a step of forming, on said substrate, a surface protection film having an opening wherein said pad electrode is exposed through said opening,
    a step of forming a resist pattern having another opening at least above said opening on the surface protection film,
    a step of conducting curing for eliminating a water content contained in the surface protection film by heating the substrate,
    a step of forming an underlying metal film after the curing step and then removing the resist pattern thereby leaving the underlying metal film to a portion for covering the opening on the surface protection film and to an extended portion thereof, and
    a step of forming balls connected with the underlying metal film.

2. A bump forming method as defined in claim 1, wherein the curing step is conducted in such a temperature range as capable of eliminating the water content contained in the surface protection film and lower than the softening temperature of the resist pattern.

3. A bump forming method as defined in claim 1, wherein the surface protection film comprises a polyimide film.

4. A bump forming method as defined in claim 1, which further includes a step of forming the resist pattern and then deforming the resist pattern.

5. A bump forming method as defined in claim 4, wherein the step of deforming the resist pattern deforms the resist pattern into an overhang shape by applying reverse sputtering thereto.

6. A bump forming method as defined in claim 5, wherein the reverse sputtering is conducted by using a plasma device capable of controlling plasma excitation and substrate bias independently.

7. A bump forming method as defined in claim 5, wherein the reverse sputtering is conducted by using a plasma device capable of attaining a plasma density of higher than $1 \times 10^{10}/\text{cm}^3$ and lower than $1 \times 10^{14}/\text{cm}^3$.

8. A bump forming method as defined in claim 1, wherein the method of forming the underlying metal film is conducted continuously after the completion of the curing step without exposing the substrate to an atmospheric air.

9. A bump forming method as defined in claim 1, wherein the step of deforming the resist pattern is conducted simultaneously with the curing step for the surface protection film.

10. A bump forming method as defined in claim 1, wherein the step of deforming the resist pattern is conducted after the completion of the curing step for the surface protection film.

11. A bump forming method as defined in claim 10, wherein the curing step for the surface protection film and the step of deforming the resist pattern are conducted continuously within one identical plasma chamber.

12. A bump forming method as defined in claim 1, wherein the pad electrode comprises an Al-containing metal film.

13. A bump forming method as defined in claim 1, wherein the underlying metal film comprises a laminate film in which a Cr film, a Cu film and an Au film are laminated in this order.

14. A bump forming method comprising the steps of:
    forming a pad electrode on a substrate;
    forming a surface protection film on said substrate having an opening wherein said pad electrode is exposed through said opening, said surface protection film comprising an organic film;
    forming a resist pattern having another opening at least above said opening in a surface protection film;
    heating the substrate for a time and at a temperature sufficient to eliminate water, if present, from the surface protection film;
    forming an underlying metal film comprising a barrier metal film;
    removing the resist pattern to thereby leave a portion of the underlying metal film covering the opening in the surface protection film and thereafter forming balls connected with the underlying metal film.

15. A method for preparing a substrate for mounting of a chip device by flip chip bonding, said method comprising the steps of:

provflding a substrate having a surface;

forming at least one first pad electrode and at least one second pad electrode in spaced relation on said surface;

forming a passivation film on said surface and said first and second pad electrodes, said passivation film having a first opening therein such that said first pad electrode is exposed in said first opening and a second opening therein such that said second pad electrode is exposed in said second opening;

forming a first organic surface protection film on said passivation film covering said first and second openings, said first organic surface protection film including a third opening therein within said first opening and exposing a portion of said first pad electrode therein and a fourth opening therein within said second opening and exposing a portion of said second pad electrode therein;

forming a first resist pattern on the first surface protection film having a fifth opening therein such that a portion of the first surface protection film about the third opening and said first pad electrode are exposed and a sixth opening therein such that a portion of the first surface protection film about the fourth opening and said second pad electrode are exposed, said sixth opening further including an extended portion extending away from the fourth opening on a side opposite said third opening exposing a further portion of said first surface protection film to provide a patterned substrate;

heating the patterned substrate at a temperature below a softening temperature of the resist pattern but sufficient to eliminate any water present in the first surface protection film from the first surface protection film;

deforming a surface portion of said resist pattern;

forming a BLM film on said deformed resist pattern and said fifth and sixth openings;

removing the deformed resist pattern to define a first portion of the BLM film in said fifth opening in contact with said first pad electrode and a second portion of the BLM film in said sixth opening in contact with said second pad electrode and extending to and overlying said further portion of the first surface protection film;

depositing a second organic surface protection film having a seventh opening therein exposing said first portion of the BLM film and an eight opening therein exposing a part of the second portion of the BLM film overlying said further portion of the first surface protection film;

forming a second resist paftern on the second organic surface protection film having a ninth opening therein exposing a portion of the second surface protection film about said seventh opening and the first portion of the BLM film and a tenth opening exposing a portion of the second surface protection film about said eight opening and said exposed part of the second portion of the BLM film;

forming a solder film on said second resist paftem and said ninth and tenth openings;

removing the second resist pattern to define a first portion of the solder film in said seventh opening in contact with said first portion of the BLM film and a second portion of the solder film in said eighth opening in contact with said part of the second portion of the BLM film; and thereafter, forming said first and second portions of said solder film into solder balls for use in mounting a chip device to said substrate by flip chip bonding.

16. A method as defined in claim 15, wherein said first pad electrode and said second pad electrode comprise aluminum.

17. A method as defined in claim 15, wherein said passivation film comprises SiN.

18. A method as defined in claim 15, wherein said first and said second surface protection films comprise polyimide.

19. A method as defined in claim 15, wherein said BLM film comprises a laminate film including a first Cr film, an intermediate Cu film and an upper Au film.

20. A method as defined in claim 15, wherein in the step of heating the patterned substrate, the patterned substrate is heated at temperatures of from about 750 to about 100° C.

* * * * *